United States Patent
Nakajima et al.

(10) Patent No.: US 7,283,408 B2
(45) Date of Patent: Oct. 16, 2007

(54) NONVOLATILE MEMORY APPARATUS ENABLING DATA TO BE REPLACED PRIOR TO SUPPLYING READ DATA AND PRIOR TO SUPPLYING WRITE DATA

(75) Inventors: Tsutomu Nakajima, Higashiyamato (JP); Satoshi Noda, Ome (JP); Kenji Kozakai, Tachikawa (JP); Atsushi Tokairin, Amagasaki (JP)

(73) Assignee: Renesas Technology Corp., Tokyo (JP)

( * ) Notice: Subject to any disclaimer, the term of this patent is extended or adjusted under 35 U.S.C. 154(b) by 108 days.

(21) Appl. No.: 11/159,303

(22) Filed: Jun. 23, 2005

(65) Prior Publication Data

US 2006/0002199 A1    Jan. 5, 2006

(30) Foreign Application Priority Data

Jul. 2, 2004    (JP)    ............................. 2004-196244

(51) Int. Cl.
G11C 11/34    (2006.01)
(52) U.S. Cl. ............. 365/200; 365/185.09; 365/189.05
(58) Field of Classification Search ....... 365/185.09 X, 365/185.11, 189.04, 189.05 X, 200 O, 230.03, 365/185.09, 189.05, 200
See application file for complete search history.

(56) References Cited

U.S. PATENT DOCUMENTS 6,421,274 B1 *    7/2002  Yoshimura ............. 365/185.12
6,639,843 B2 *   10/2003  Miyauchi ............... 365/185.29
6,819,608 B2    11/2004  Watanabe ................... 365/200

FOREIGN PATENT DOCUMENTS

JP    2004-55100    2/2004

* cited by examiner

Primary Examiner—VanThu Nguyen
(74) Attorney, Agent, or Firm—Miles & Stockbridge P.C.

(57) ABSTRACT

A nonvolatile memory apparatus which need not compare an access address with a faulty address every time for rescuing from any fault is to be provided. The apparatus has memory arrays, data registers for inputting and outputting data to and from the memory arrays, and control circuits. The control circuits, after transferring a plurality of sets of data from the memory arrays to the data registers in response to an instruction to read data, take out rescuing data out of the plurality of sets of data transferred to the data registers, and perform processing to replace with the taken-out rescuing data corresponding faulty addresses on the data register to enable the data on the data register to be supplied to the outside. When any faulty data in the read data are to be replaced with rescuing data on any data register to which data have been transferred from any memory array, read access addresses need not be checked whether or not they are faulty every time an access address is supplied from outside.

10 Claims, 12 Drawing Sheets

NONVOLATILE MEMORY APPARATUS ENABLING DATA TO BE REPLACED PRIOR TO SUPPLYING READ DATA AND PRIOR TO SUPPLYING WRITE DATA

CROSS REFERENCE TO RELATED APPLICATION

The present application claims priority from Japanese patent application No. 2004-196244 filed on Jul. 2, 2004, the content of which is hereby incorporated by reference into this application.

BACKGROUND OF THE INVENTION

The present invention relates to a nonvolatile memory apparatus permitting rescue from faults by redundancy, and more particularly to a technique that can be effectively applied to a nonvolatile memory apparatus permitting electrical rewriting, such as a flash memory.

In volatile memories including static random access memories (SRAMs and dynamic random access memories (DRAMs) as well as in nonvolatile memories including flash memories, memory cells and bit lines are rescued from faults by providing redundancy in a memory array. This rescue from faults is accomplished by having faulty addresses corresponding to faulty memory cells and bit lines stored, determining with an access address supplied from outside whether or not the memory cells and bit lines to be accessed include any faulty memory cell or bit line indicated by a faulty address (hereinafter referred to as faulty address determination) and, if they include any redundant memory cell, which corresponds to a rescuing address, is made accessible in place of the faulty memory cell or bit line. Patent Reference 1 discloses a nonvolatile memory having redundancy for rescue from faults, more particularly a configuration in which faulty addresses are stored in the memory cells of a nonvolatile memory and a rescuing address is read into a latch and made available for use when the power supply is turned on.

Patent Reference 1: Japanese Unexamined Patent Publication No. 2004-55100

SUMMARY OF THE INVENTION

However, determination of any faulty address every time an access address is supplied takes no little length of time in itself and poses an obstacle to faster accessing.

An object of the present invention is to provide a nonvolatile memory apparatus which need not perform faulty address determination every time and can thereby contribute to faster accessing.

The aforementioned and other objects and novel features of the invention will become apparent from the following description in this specification when taken in conjunction with the accompanying drawings.

Typical aspects of the invention disclosed in the present application will be briefly described below.

[1] A nonvolatile memory apparatus comprises memory arrays, data registers for inputting and outputting data to and from the memory arrays, and control circuits (6, 7, 12, 14, 16 and 18). The control circuits, after transferring a plurality of sets of data from the memory arrays to the data registers in response to an instruction to read data, take out rescuing data out of the plurality of sets of data transferred to the data registers, and perform processing to replace with the taken-out rescuing data corresponding faulty addresses on the data register to enable the data on the data register to be supplied to the outside.

When any faulty data are to be replaced, in reading by the above-described means, with rescuing data on any data register to which data have been transferred from any memory array, the rescuing data can be taken out, the address of the faulty data designated, and the faulty data replaced with the rescuing data. Therefore, read access addresses need not be checked as to whether or not they are faulty every time an access address is supplied from outside.

In writing data, the control circuits, after transferring a plurality of sets of write data to the data registers in response to an instruction to write data, further take out data of faulty addresses out of the plurality of sets of data transferred to the data registers, and perform processing to replace with the taken-out data of faulty addresses to replace data of the corresponding rescuing addresses to enable the plurality of sets of data on the data registers to be written into the memory arrays.

When data of any faulty address are to be transferred to a rescuing address on any data register to which write data have been transferred by the above-described means, the data of the faulty address can be taken out and replaced with the rescuing address. Therefore, write access addresses need not be checked as to whether or not they are faulty every time an access address is supplied from outside.

In a specific mode of the invention, the memory cells of the memory arrays are electrically rewritable nonvolatile memory cells, and the data registers have a plurality of static memory cells in their storage areas.

Here, the memory arrays have rescuing areas to each of which a plurality of rescuing addresses are allocated and which store data of faulty addresses and rescued areas to be rescued by the rescuing areas, and the control circuits have nonvolatile registers each capable of storing a plurality of faulty addresses in the rescued areas. Also, the control circuits use as a signal for designating a storage area in the nonvolatile registers some of a plurality of bits contained in each address signal for designating the rescuing address. Reading of a faulty address and the designation of the rescuing address of the rescuing area for use in rescuing the faulty data of that faulty address can be selectively matched with each other.

[2] A nonvolatile memory apparatus comprises memory arrays, data registers for inputting and outputting data to and from the memory arrays, and control circuits. Each of the memory arrays comprises a plurality of data storage units and, in each data storage unit, a rescued area and a rescuing area. To focus on the read operation, each of the control circuits, after transferring data of data storage units from the memory array to the data register in response to an instruction to read data, performs processing to replace faulty data in the rescued area with corresponding rescuing data in a rescuing area on the data register to enable the data on the data register to be supplied to the outside.

When any faulty data are to be replaced, in reading by the above-described means, with rescuing data on any data register to which data have been transferred from any memory array, the rescuing data can be taken out, the address of the faulty data designated, and the faulty data replaced with the rescuing data. Therefore, read access addresses need not be checked as to whether or not they are faulty every time an access address is supplied from outside.

To focus on the write operation, the control circuits, after storing write data in an equivalent of the data storage unit into the data register in response to an instruction to write data, perform processing to replace with rescuing data in the rescuing area corresponding data in the rescued area on the data register to enable the data on the data register to be written into the memory array.

When data of any faulty address are to be shifted to a rescuing address on any data register to which write data have been transferred by the above-described means, the data of the faulty address can be taken out and replaced with the rescuing address. Therefore, write access addresses need not be checked as to whether or not they are faulty every time an access address is supplied from outside.

In a specific mode of the invention, each of the memory arrays has a plurality of memory cells of which the selection terminals and the data input/output terminals are respectively connected to word lines and bit lines, and a storage area comprising memory cells connected to one word line constitutes the data storage unit. Herein, each of the registers has a storage area equal to the data storage unit in storage capacity.

In another specific mode of the invention, each of the control circuits has a nonvolatile register for storing as faulty addresses a plurality of addresses in the rescued area to be rescued by the rescuing area. Herein, each of the control circuits determines as being not rescued a specific value held by the nonvolatile register and restrains the replacement processing of any such unrescued value. There is no need to have separate control information indicating whether or not it is to be rescue-enabled.

In still another specific mode of the invention, the memory cells of the memory arrays are electrically rewritable nonvolatile memory cells, and the data registers have a plurality of static memory cells in their storage areas.

Advantages provided by typical aspects of the invention disclosed in the application are briefly described below.

Thus faulty address determination between faulty address and access address for rescuing from any fault that may occur need not be performed every time, resulting in a contribution to faster accessing.

DETAILED DESCRIPTION OF THE PREFERRED EMBODIMENTS

<Overall Configuration of Flash Memory>

Figure 1:
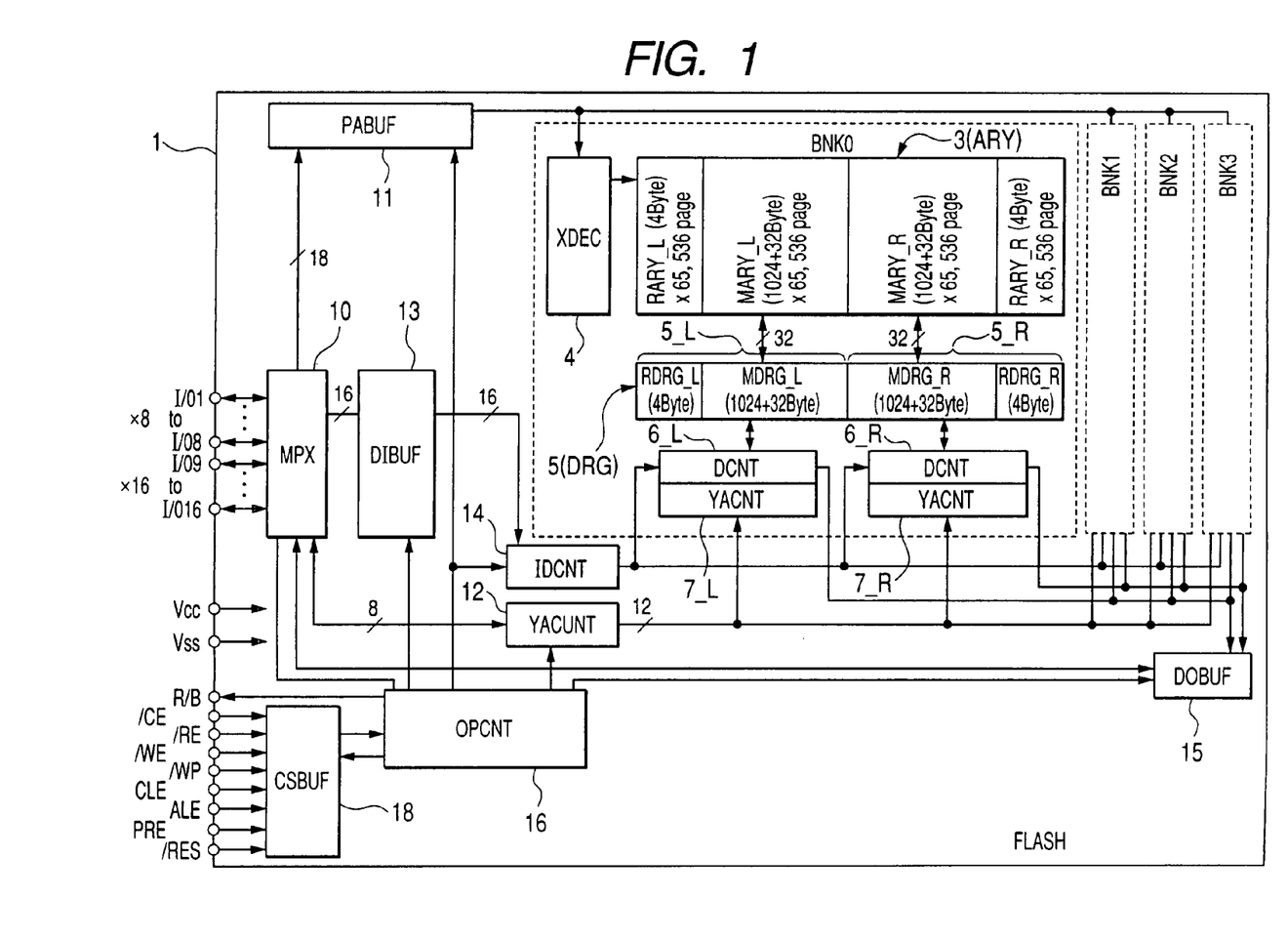
FIG. 1 is a block diagram of a flash memory, which is an example of nonvolatile memory apparatus.

FIG. 1 shows a flash memory as an example of nonvolatile memory apparatus. A flash memory 1 is formed over a single semiconductor substrate of single crystal silicon or the like.

A flash memory 1 has four memory banks BNK0 through BNK3, though their number is not necessarily limited to four. The memory banks BNK0 through BNK3 are all the same in configuration, and can be operated in parallel. FIG. 1 shows the memory bank BNK0 in detail as representative of the four. Each of the memory banks BNK0 through BNK3 has a flash memory array (ARY)3, an X decoder (XDEC) 4, data registers (DRG) 5, data control circuits (DCNT) 6_R and 6_L, and Y address control circuits (YACNT) 7_R and 7_L.

The memory array 3 has electrically erasable and writable nonvolatile memory cells (not shown) arranged in a matrix. A nonvolatile memory cell 20, though not illustrated, has a suitable memory cell structure, which may be a stacked gate structure in which a control gate is stacked over a floating gate with an insulating film between them or a split gate structure in which a selective transistor and a memory transistor having a silicon nitride film are arranged in series. In a nonvolatile memory cell of the stacked gate structure for instance, the control gate is connected to a word line, the drain to a bit line, and the source to a source line. Erasure processing for a nonvolatile memory of the stacked gate structure may be, though not limited to, processing to reduce the threshold voltage by applying a high positive voltage to the control gate as an erasure bias and thereby causing the floating gate to discharge electrons. Processing to write into a nonvolatile memory cell of the stacked gate structure may be, though not limited to, processing to raise the threshold voltage by applying a high negative voltage to the drain to inject electrons into the floating gate. Processing to read out is supposed to be processing to make stored information detectable from a variation in current flowing to a bit line or a variation in voltage level emerging on the bit line by selecting a memory cell transistor with a word line selection level as the prescribed determination level. The bit line is connected to one of the input/output nodes of a sense latch circuit (not shown). The sense latch circuit is used for latching stored information read out onto a bit line or driving a bit line in latch or write processing. The other input/output node of the sense latch circuit is connected to the input/output nodes of a plurality of main amplifiers via a selector in units of a plurality of bits. Incidentally, each nonvolatile memory cell may store either two values of one bit each or multiple values of two or more bits of information. In the case of two-bit values, for instance, data registers connected to bit lines are further provided, though this is not the only conceivable configuration, and read processing is performed by determining two-bit stored data while separately holding in a sense latch and a data register the results before and after reading out of the memory cell a number of times at different read determination levels. Write processing is performed by setting a threshold voltage according to the two-bit value while separately holding in a sense latch and a data register the two-bit write data.

The flash memory array 3 is divided into main areas MARY and redundant areas RARY. The redundant areas RARY are used for rescue from any faulty address in the main areas MARY. As will be described afterwards, this rescue is a column rescue, in other words a Y address rescue. The main areas MARY are divided into right and left areas (MARY_R and MARY_L) and each of the main areas MARY_R and MARY_L has a storage capacity for 65,536 pages of 1024+32 bytes each. The redundant areas RARY are also divided into right and left areas (RARY_R and RARY_L), and each of the redundant areas RARY_R and RARY_L has a four-byte storage capacity for 65,536 pages. Here, the data storage unit (one page) is 1024+32+4 bytes; in this data storage unit, four bytes matching each of the redundant areas RARY_R and RARY_L are supposed to constitute a rescuing area, and 1024+32 bytes matching each of the main areas MARY_R and MARY_L are supposed to constitute a rescued area. Odd-number pages are allocated to the main area MARY_L and the redundant area RARY_L on the left side, and even-number pages to the main area MARY_R and the redundant area RARY_R on the right side. An X decoder decodes page addresses as access addresses to the flash memory array and, though this is not the only possibility, selects a memory cell for each page in a x8-bit input/output mode. In a x16-bit input/output mode, it selects a memory cell for two pages each at each even-number address.

The data registers 5 have a static memory array, and the static memory array is divided into main areas MDRG and redundant areas RDRG. The redundant areas RDRG are used for rescue in the data storage of faulty addresses in the main areas MDRG. The main areas MDRG are divided into right and left areas (MDRG_R and MDRG_L), and each of the main areas MDRG_R and MDRG_L has a storage capacity for 1024+32 bytes. The redundant areas RDRG are also divided into right and left areas (RDRG_R and RDRG_L), and each of the redundant areas RDRG_R and RDRG_L has a storage capacity for 4 bytes. Each of the areas MDRG_R and RDRG_R and the areas MDRG_L and RDRG_L has a storage capacity for an equivalent of one page as the data storage unit. For the sake of convenience, the data register provided with the areas MDRG_R and RDRG_R will be referred to as the data register 5_R, and that provided with the areas MDRG_L and RDRG_L, as the data register 5_L.

The flash memory array 3 and the data registers 5 input and output data. When the selector provided in the flash memory array 3 connects the other input/output nodes of the sense latch circuit to the input/output nodes of the main amplifiers in 32-bit units for instance, the selection by the selector is automatically changed over by an internal clock sequentially to enable a one-page equivalent of data to be transferred between the memory array 3 and the data registers 5_L and 5_R.

The data registers 5_L and 5_R are composed of, for instance, SRAMs. The areas MDRG_R and RDRG_R and the areas MDRG_L and RDRG_L are composed of separate SRAMs. The data control circuit 6_R (6_L) controls the inputting and outputting of data to and from the data register 5_R (5_L). The Y address control circuit 7_R (7_L) performs address control over the data register 5_R (5_L). In particular, as will be described in detail afterwards, when responding to an instruction to read data, the Y address control circuit 7_R (7_L) replaces data of a faulty address with rescuing data on the data register 5_R (5_L) or, when responding to an instruction to write data, performs address control or the like to replace data of a faulty address with data of a rescuing address on the data register 5_R (5_L).

External input/output terminals I/O1 through I/O16, concurrently used as address input terminals, data input terminals, data output terminals and command input terminals, are connected to a multiplexer (MPX) 10. A page inputted to the external input/output terminals I/O1 through I/O16 is inputted from the multiplexer 10 to a page address buffer (PABUF) 11, and the Y address (column address) is preset from the multiplexer 10 to a Y address counter (YACUNT) 12. Write data inputted to the external input/output terminals I/O1 through I/O16 are supplied from the multiplexer 10 to a data input buffer (DIBUF) 13. The write data inputted to the data input buffer 13 are inputted to the data control circuits 6_L and 6_R via an input data control circuit (IDCNT) 14. For data input or output to or from the external input/output terminals I/O1 through I/o16, either x8 bits or x16 bits are selected. When a x16-bit input/output is selected, the input data control circuit 14 gives 16-bit write data in parallel to match the data control circuits 6_R and 6_L. When a x8-bit input/output is selected, the input data control circuit 14 gives 8-bit write data to the data control circuit 6_L where the page number is odd or 8-bit write data to the data control circuit 6_R where the page number is even. Read data outputted from the data control circuits 6_R and 6_L are supplied to the multiplexer 10 via a data output buffer (DOBUF) 15, and outputted from the external input/output terminals I/O1 through I/O16.

Part of the command codes and address signals supplied to the external input/output terminals I/O1 through I/O16 is supplied from the multiplexer 10 to an internal control circuit (OPCNT) 16.

A page address X supplied to the page address buffer 11 is decoded by the X decoder 4, and a word line is selected from the memory arrays 3 according to the result of that decoding. The Y address counter 12, in which the Y address supplied to the page address buffer 11 is preset, may be a 12-bit counter, though this is not the only possibility. It counts addresses starting from the preset value, and supplies the counted Y addresses to the Y address control circuits 7_R and 7_L. The counted Y addresses are used as address signals when write data from the input data control circuit (IDCNT) 14 are to be written into the data registers 5 or when read data to be supplied to the output buffer 15 are selected out of the data registers 5. The Y address supplied to the page address buffer 11 is equal to the leading one of the counted Y addresses. This leading Y address is referred to as the leading accessed Y address.

A chip enable signal /CE, a command latch enable signal CLE, an address latch enable signal ALE, a write enable signal /WE, a read enable signal /RE, a write protect signal /WP, a power-on read enable signal PRE and a reset signal /RES are supplied to a control signal buffer (CSBUF) 18 as access control signals from outside. The "/" prefixed to a signal sign means that it is a row-enable signal.

The chip enable signal /CE is a signal for selecting the operation of the flash memory 1. At its low level, the flash memory (device) 1 is activated (made operable) and at its high level, the flash memory 1 is caused to stand by (suspended from operation). The read enable signal /RE controls the timing of data outputting from the external input/output terminals I/O1 through I/O16, and data are read out in synchronism with clock variations of the signal. The write enable signal /WE instructs at its leading edge the flash memory 1 to capture commands, addresses and data. The command latch enable signal CLE is a signal to designate as a command data supplied from outside to the external input/output terminals I/O1 through I/O16; when the data of the input/output terminals I/O1 through I/O16 are at CLE="H" (high level), it is captured in synchronism with the leading edge of /WE and recognized as a command. The address latch enable signal ALE is a signal to indicate that data supplied from outside to the external input/output terminals I/O1 through I/O16 represent an address; when the data of the input/output terminals I/O1 through I/O16 are at ALE="H" (high level), it is captured in synchronism with the leading edge of /WE and recognized as a command. When the write protect signal /WP is at its low level, the flash memory 1 is prohibited from erasure and writing. The power-on read enable signal PRE is enabled when a power-on read function is used by which neither a command nor an address is inputted after power supply is turned on but data in a prescribed sector are read out. The reset signal /RES instructs an action to have the flash memory 1 initialized by transition from the low level to the high level after power supply is turned on.

The internal control circuit 16 performs interface control in accordance with the access control signals and the like, and controls internal actions in accordance with inputted commands, such as erase processing, write processing and read processing. The internal control circuit 16 also outputs a read/busy signal R/B. The read/busy signal R/B is reduced to its low level during the operation of the flash memory 1, and thereby causes the busy state to be notified to outside. Vcc denotes the source voltage and Vss, the ground voltage. The high voltage needed for write processing and erase processing is generated by an internal boosting circuit (not shown) on the basis of the source voltage Vcc.

<Mode of Operation to Access Flash Memory>

Figure 2:
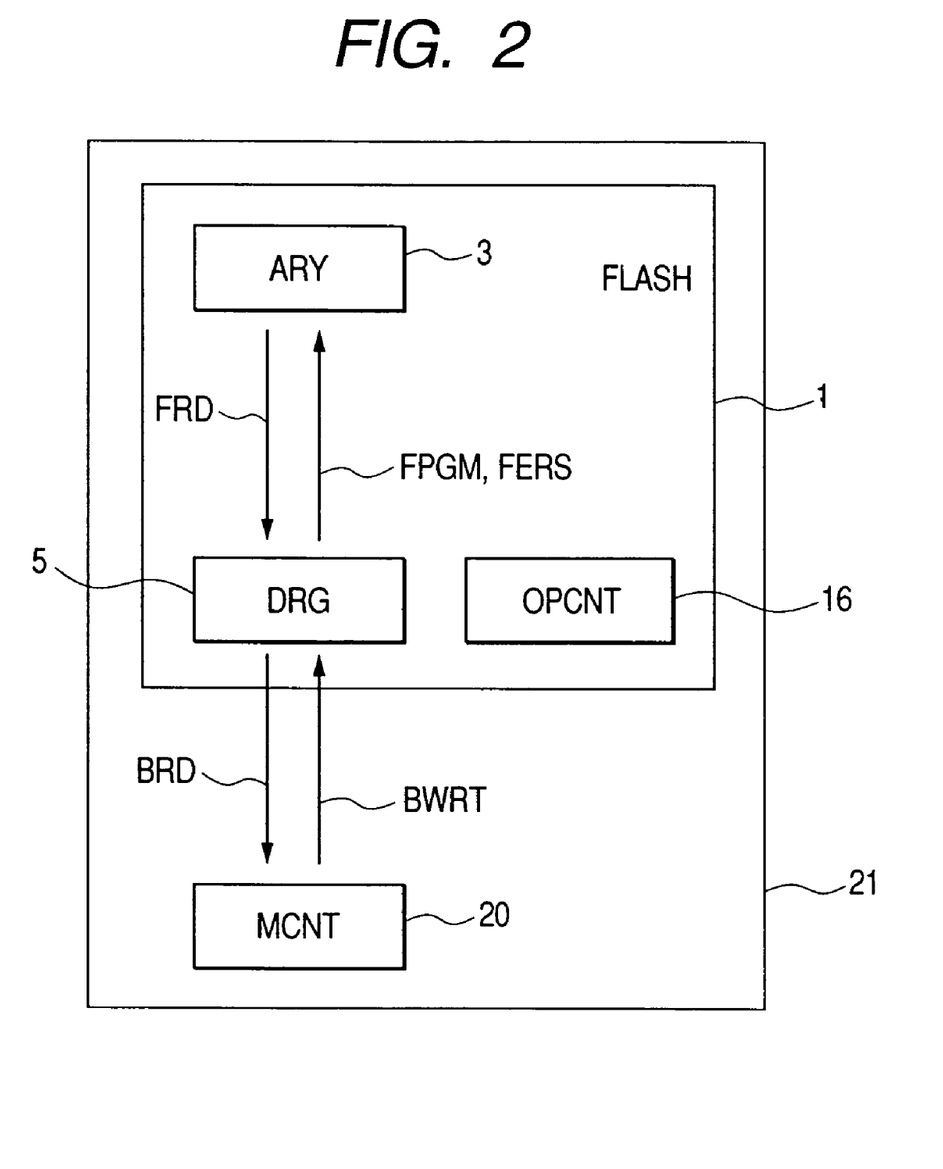
FIG. 2 illustrates an example of main operating mode of the flash memory.

FIG. 2 illustrates the main operating mode of the flash memory 1. ARY3 is a general sign covering the memory arrays of all the banks and DRG5, the data registers of all the banks. MCNT 20 denotes a flash memory controller arranged outside the flash memory 1. Supposing the use of, for instance, a memory card 21 conforming to PCMCIA (Personal Computer Memory Card International Association) or the like, the flash memory controller 20 is a memory card controller. The internal control circuit (OPCNT) 16 can separately control both first access processing between outside the flash memory 1 and the data register 5 and second access processing between the memory array 3 and the data register 5, each under instruction from outside. The modes of the first access processing can be broadly classified into buffer write processing BPGM of writing data into the data register 5 from outside the flash memory 1 and buffer read processing BRD of reading data out of the data register 5 to outside the flash memory 1. The modes of the second access processing can be broadly classified into flash program processing FPGM or writing stored information held by the data register 5 into a prescribed area in the memory array 3, flash erase processing FERS of erasing a prescribed area in the memory array 3, and flash read processing FRD of reading out stored information in a prescribed area in the memory array 3 and having it held by the data register 5.

Figure 3:
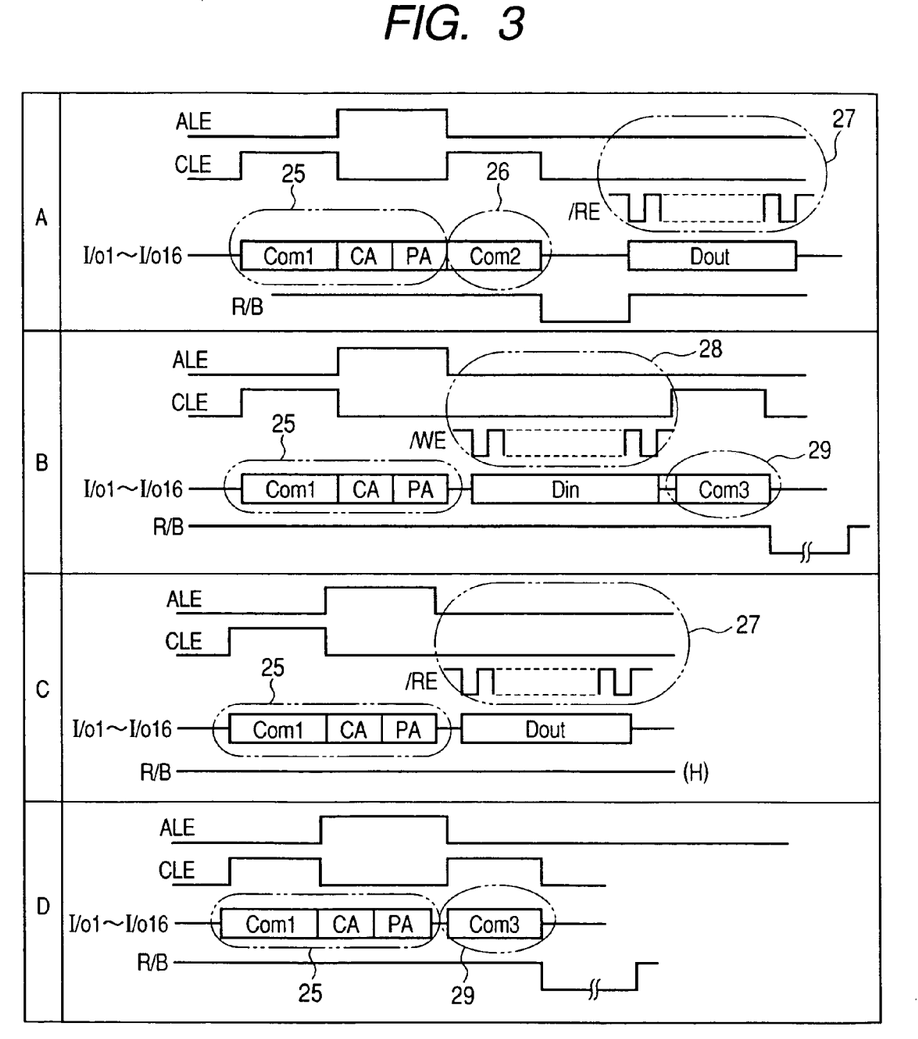
FIG. 3 illustrates operations typifying forms of instruction to the flash memory for first access processing and second access processing.

FIG. 3 illustrates operations typifying forms of instruction to the flash memory for the first access processing and the second access processing. In the drawing, reference numeral 25 denotes an address command; Com1, an address command code; CA, access leading Y address information for the data register 5; and PA, page address information. The access leading Y address information is preset on the Y address counter 12. Reference numeral 26 denotes an access command instructing the start of the flash read processing FRD as the second access processing, and it is instructed with a command code Com2. In box A of FIG. 3, reference numeral 27 denotes a part instructing the buffer read processing BRD in the first access processing. This instruction of the buffer read processing BRD is given by, for instance, demanding a state of read enable (/RE=L) in a state of command latch disable (CLE=L) and address latch disable (ALE=L). In the flash read processing FRD instructed by the access command 26, the read address is designated by page address information PA. The resultant state in which the transfer of read data from the flash memory array to the data register 5 is notified to outside the flash memory 1 by the ready state (R/B=L) of the read/busy signal R/B. The instruction 27 of the buffer read processing BRD is given from outside when the read/busy signal R/B enters into the ready state. When the instruction 27 of the buffer read processing BRD is given, data are successively supplied outside from the data register 5 in synchronism with the clock variations of the read enable signal /RE, beginning with the leading data designated by the access leading Y address information CA. The output data are denoted by Dout in the illustration.

In box B of FIG. 3, reference numeral 28 denotes a part instructing the buffer write processing BWRT as the first access processing. The instruction 28 of the buffer write processing BWRT is given by, for instance, demanding a state of write enable (WEb=L) in a state of command latch disable (CLE=L) and address latch disable (ALE=L). When the instruction 28 of the buffer write processing BWRT is given, input data Din are successively stored into the data register 5 of the memory bank specified by the page address information PA in synchronism with the clock variations of the write enable signal /WE, beginning with the leading data designated by the access leading Y address information CA. Reference numeral 29 denotes an access command instructing the flash program processing FPGM as the second access processing, and it is instructed with a Com3. When the flash program processing FPGM is instructed, stored information in the data register 5 is written into a page address of the flash memory array ARY designated by the page address information PA. Until this write operation is completed, the read/busy signal R/B is kept in a busy state.

In box C of FIG. 3, the access command 26 to instruct the flash read processing FRD as the second access processing in box A of FIG. 3 is omitted, the instruction 27 of the buffer read processing BRD is given as the first access processing immediately after the address command 25. In this form of instructing access processing, data Dout are successively supplied from the data register 5 of the memory bank specified by the page address information PA of the address command 25 in synchronism with the clock variations of the read enable signal /RE, beginning with the leading data designated by the access leading Y address information Y address CA. Where data already held by the data register are to be read, since the flash read processing FRD in accordance with the access command 26 can be dispensed with, there is no need for data to be read out of the flash memory array ARY into the data register, and therefore the timing of the outward supply of the data to be read can be advanced.

In box D of FIG. 3, the instruction 28 of the buffer write processing BWRT as the first access processing in box B of FIG. 3 is omitted, an instruction 29 of the flash program processing FPGM as the second access processing is given immediately after the address command 25. In this form of instructing access processing, stored information in the data register 5 in the memory bank BNKi determined according to the page address information PA of the address command 25 is written into the page of the flash memory array ARY designated by the page address information PA. Since the first access processing 28 is not instructed here, there is no need to wait for a transfer of write data from outside to the data register 5. Where data already held by the data register 5 are to be read, since the buffer write processing BWRT can be dispensed with, there is no need for write data to be transferred from outside and therefore the time taken for the writing to be completed can be shortened.

The writing or reading in accordance with command codes can cover any range between one and four pages. The page address information needed for writing or reading a plurality of pages can be obtained by repeating a plurality of times the address commands beginning with Com1. The write data needed for writing a plurality of pages can be inputted in accordance with the first access processing every time page address information is entered.

<Y Address Rescue by Redundancy>

On the basis of the foregoing description, a specific example of column rescue will be described below.

Figure 4:
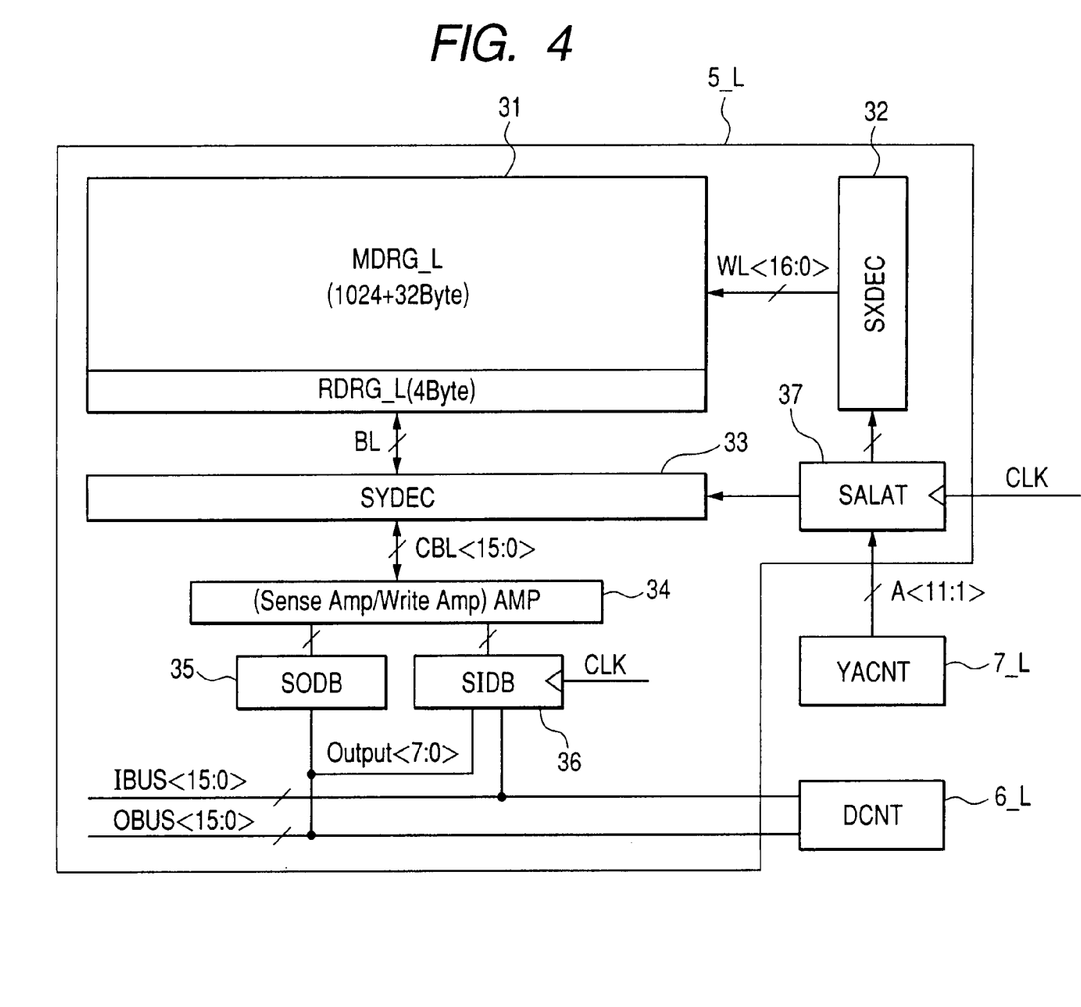
FIG. 4 is a block diagram of one example of data register 5_L.

FIG. 4 shows one example of data register 5_L. The data register 5_L is configured of an SRAM, and each of MDRG_L and RDRG_L is composed of an SRAM array 31 in which static type memory cells are arranged in a matrix form. The selection terminals of the static type memory cells are connected to word lines WL and their data input/output terminals, to bit lines BL. The word lines are selected by an X decoder (SXDEC) 32. The bit lines are selected in 16-bit units by a Y decoder (SYDEC) 33, and kept in communication with a common data line CBL. An amplifier circuit (AMP) 34 is coupled to the common data line CBL. The amplifier circuit 34 hasa sense amplifier andawrite amplifier. The sense amplifier amplifies data read out of the SRAM array 31, and the amplified data are supplied from a data output buffer (SODB) 35 to an output bus OBUS. Write data supplied to an input bus IBUS are inputted to a data input buffer (SIDB) 36. The write amplifier drives the pertinent bit line via a common data line CBL in accordance with the inputted write data, and data are thereby written into memory cells. The input bus IBUS and the output bus OBUS are connected to DCNT 6_L. Address signals are supplied to SXDEC 32 and SYDEC 33 from an address latch circuit (SALAT) 37. In the example of FIG. 4, there are supposed to be 17 word lines WL, with the common data line CBL handling 16 bits, and IBUS and OBUS, 16 bits each. An address signal A<11:1> is supplied to the address latch circuit 37 from theY address control circuit 7_L. The address signal is supposed to be a byte address. A<11:1> is supplied to SALAT 37 from SXDEC 32, and A<6:1> is supplied to SYDEC 33 from SALAT 37. The data register 5_R is similarly configured.

Figure 5:
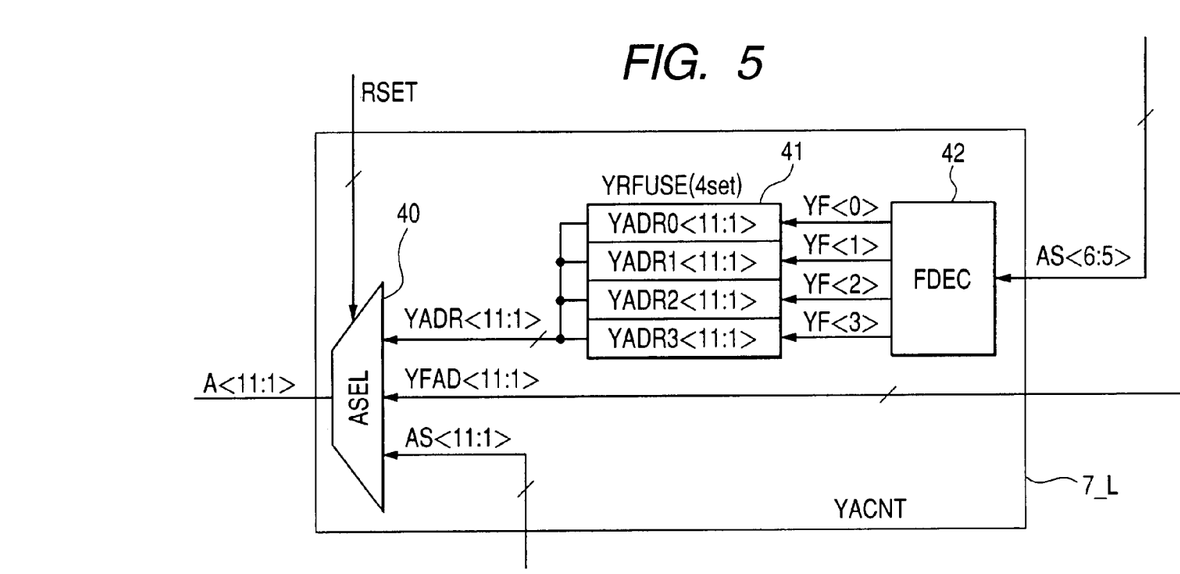
FIG. 5 is a block diagram of one example of Y address control circuit 7_L.

FIG. 5 shows one example of Y address control circuit 7_L. The Y address control circuit 7_L has an address selector 40, a fuse circuit 41 and a fuse decoder (FDEC) 42. The fuse circuit 41 is an example of nonvolatile register for storing faulty addresses. It has four fuse sets, and can hold a maximum of four faulty addresses YADR 0<11:1> through YADR 3<11:1>. The fuse circuit 41 may use electric fuses, laser fuses or flash memory cell fuses. The faulty addresses YADR 0<11:1> through YADR 3<11:1> are supposed to be Y addresses, and four addresses on the memory array MARY_L side and four on the memory array MARY_R side, or a total of eight Y addresses can be rescued on each of the memory banks BNK0 through BNK3. The fuse decoder 42 generates selection signals YF<0> through YF<3> for selecting one or another of four fuse sets by decoding a two-bit address AS<6, 5>. A faulty address YADR<11:1> selected by the fuse circuit 41, rescuing addresses (redundant rescuing addresses) YFAD <11:1> individually allocated to the four fuse sets of the fuse circuit 41, and a Y address AS<11:1> outputted from the Y address counter 12 and common to the memory banks are supplied to the address selector 40. Which address to select is controlled with a rescue processing control signal RSET. The output of the address selector 40 is supposed to be the access address to the data register 5_L. The rescuing address YFAD <11:1>, the input address AS<6, 5> of the fuse decoder 42 and the rescue processing control signal RSET are supplied by the internal control circuit 16 when rescue processing, to be described in detail afterwards, is performed. The configuration is the same for the Y address control circuit 7_R.

Figure 6:
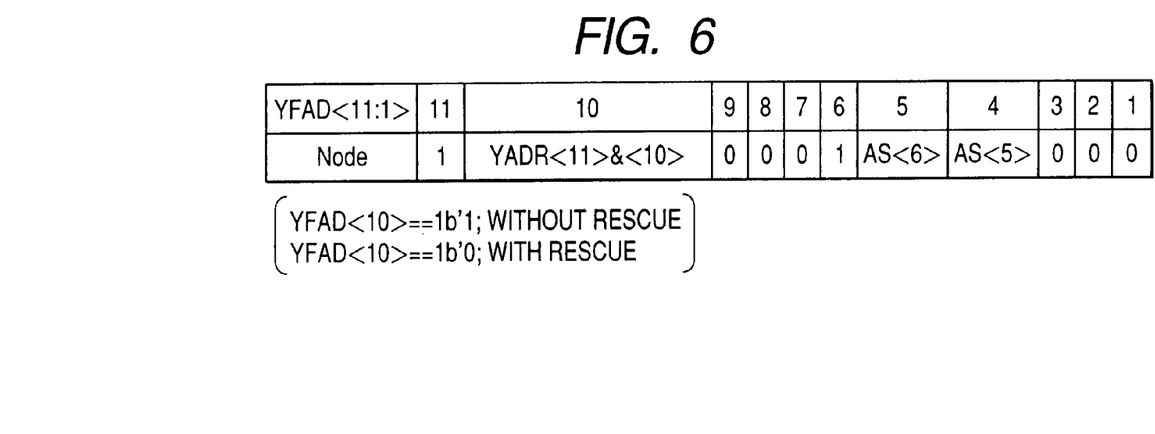
FIG. 6 is a format diagram showing an example of address format of rescuing address YFAD <11:1>.

FIG. 6 shows an example of address format of the rescuing address YFAD<11:1>. A rescuing address bit YFAD<4>=AS<5> and a rescuing address bit YFAD<5>=AS<6> are supposed, and a rescuing address YFAD<11:1> is caused to vary in synchronism with the variation of AS<6, 5>. A rescuing address bit YFAD<10> is supposed to be the logical product of YADR<11> and YADR<10>. YADR<11> and YADR<10> are considered substantially meaningless address bits in the designation of the rescuing address YFAD<11:1>, and are used as rescue enable bits indicating with/without rescue. When the rescuing address bit YFAD<10> is a logical product 1, it means without rescue and when it is a logical product 0, it means with rescue. Therefore, if a logical product 1 is set for every bit in a fuse set that undergoes no rescue in the fuse circuit 41, the rescuing address YFAD<11:1> will be treated as without rescue.

Figure 7:
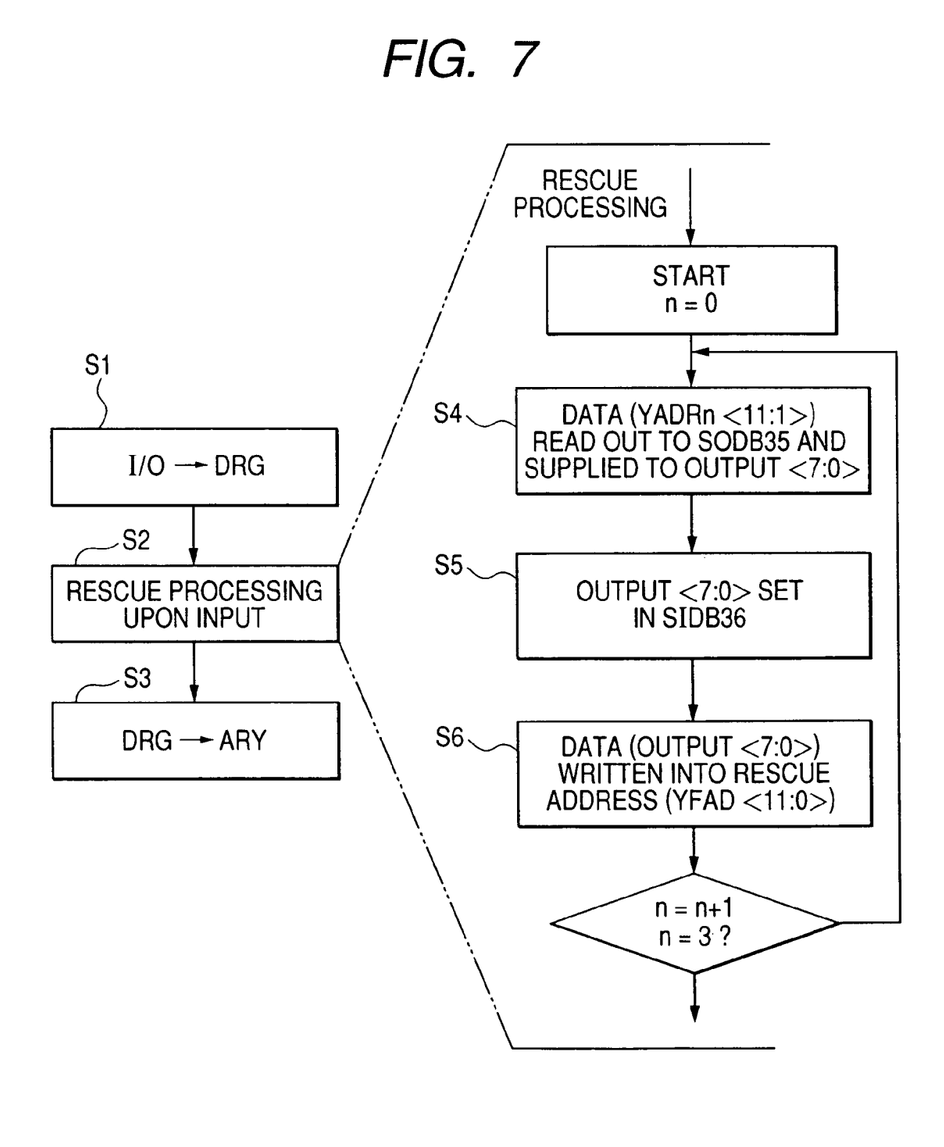
FIG. 7 is a flow chart showing an example of rescue processing flow at the time of data inputting.

FIG. 7 shows a rescue processing flow at the time of data inputting. In response to an instruction to write data, the buffer write processing is performed in the memory bank to be written into (S1), followed by rescue processing on the data register (S2). After the rescue processing, the flash program processing is made possible (S3). In rescue processing at the time of data inputting (S3), the data are read out into SODB35 from the data register according to a faulty address YADRn<11:1> supplied from the fuse circuit (S4) and internally transferred from SODB35 to SIDB36 (S5), and the data held by SIDB36 are written onto a data register designated by the rescuing address YFAD<11:1> (S6). This processing is applied to four faulty addresses YADR0<11:1> through YADR 3<11:1>. This causes data corresponding to the faulty addresses YADR 0<11:1> through YADR 3<11:1> to be copied as rescuing data into a redundant area RDRG_L in the main area MDRG_L of the data register 5_L. By writing stored information into the memory array 3 of the data register 5_L in this state, the rescuing data are written into the redundant array RARY_L. Similar processing takes place when the data register 5_R side is selected.

Figure 8:
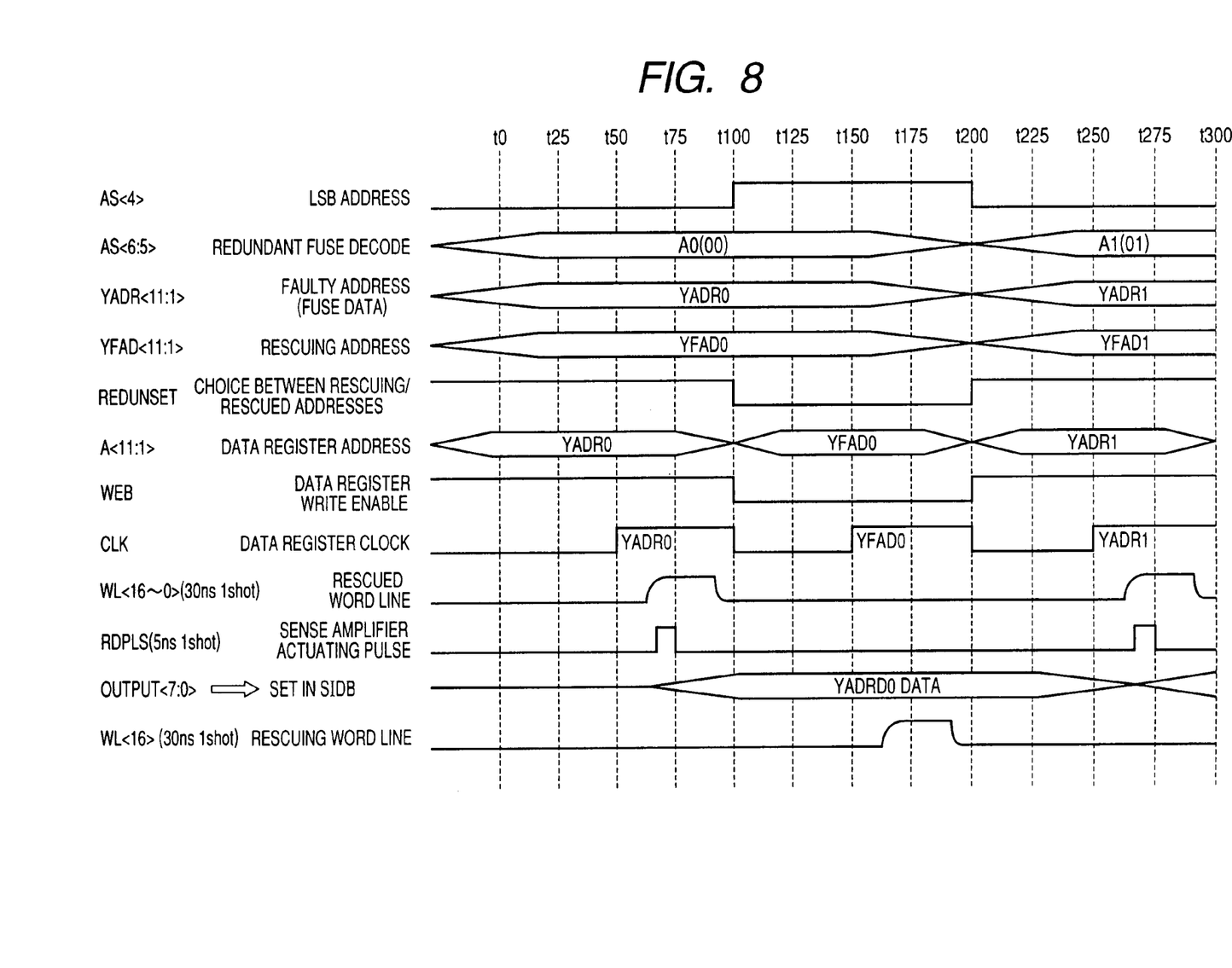
FIG. 8 is a timing chart showing the first half of rescue processing at the time of data inputting.
Figure 9:
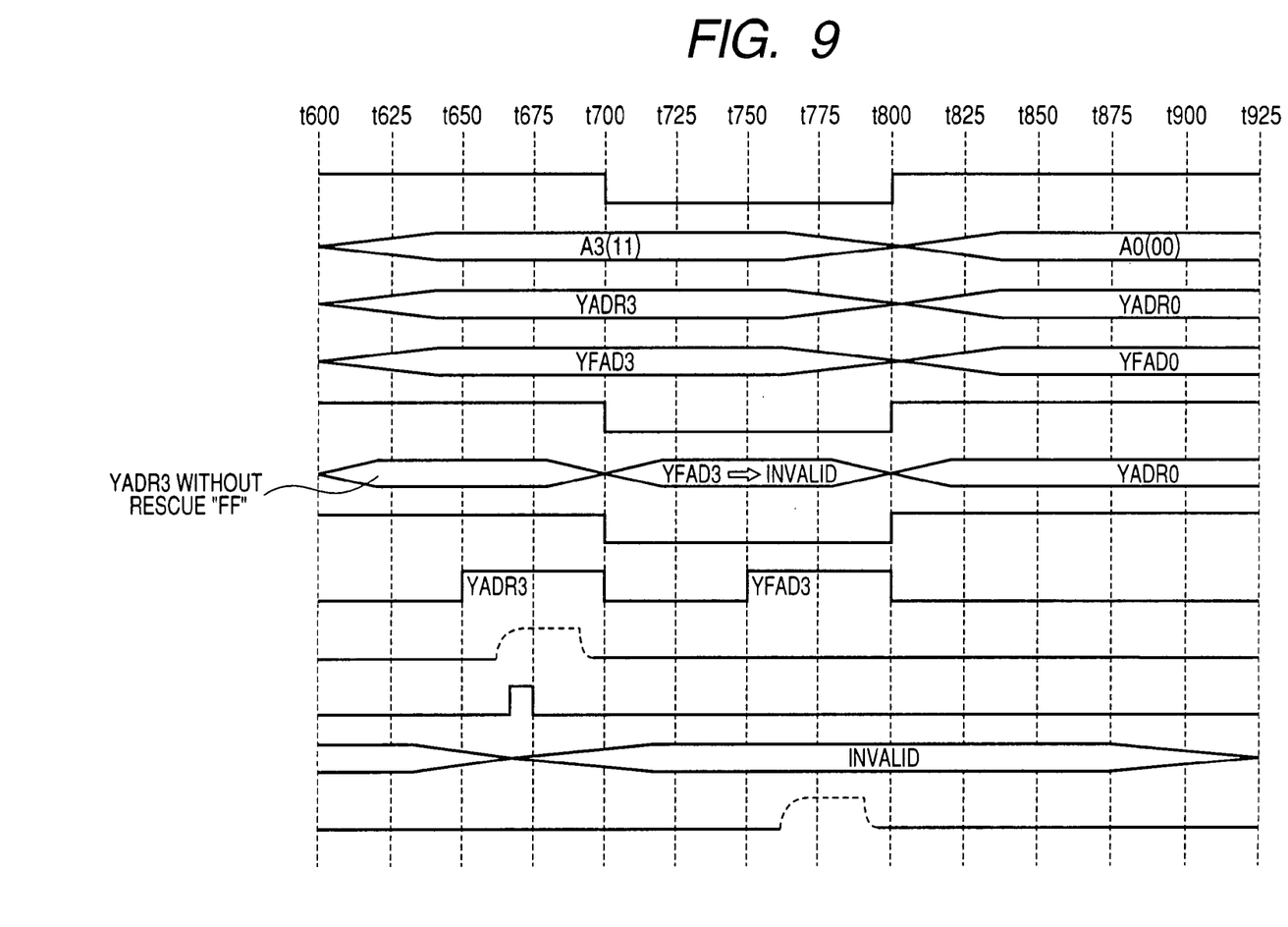
FIG. 9 is a timing chart showing the second half of rescue processing at the time of data inputting.

FIG. 8 and FIG. 9 are timing charts showing respectively the first and second halves of the rescue processing at the time of data inputting. Until time t200, the redundant fuse code AS<6, 5> is selected as AO<0, 0>, and a faulty address YADR 0 is outputted from the fuse circuit as fuse data, when the rescuing address is YFAD 0. In the first half until time t100, the faulty address YADR 0 is selected as the data register address A<1:1>, and the data YADR 0 DATA of the faulty address are latched from SODB35 to SIDB36. In the second half from time t100 through t200, the rescuing address YFAD 0 is selected as the data register address A<1:1>, and the data YADR 0 DATA of SIDB36 are stored at the rescuing address YFAD 0.

From time t600 through time t800 in FIG. 9, the redundant fuse code AS<6, 5> is selected as A3<1, 1>, the faulty address YADR 3 is supplied from the fuse circuit as fuse data, when the rescuing address is YFAD 3. In this example, a logical product 1 is set for every bit in YADR 3, indicating the absence of rescue. Then, no word line is selected in the SRAM array 31, where read operation is restrained and, as YFAD<10> of YFAD 3 also indicates the absence of rescue, write operation is restrained.

Figure 10:
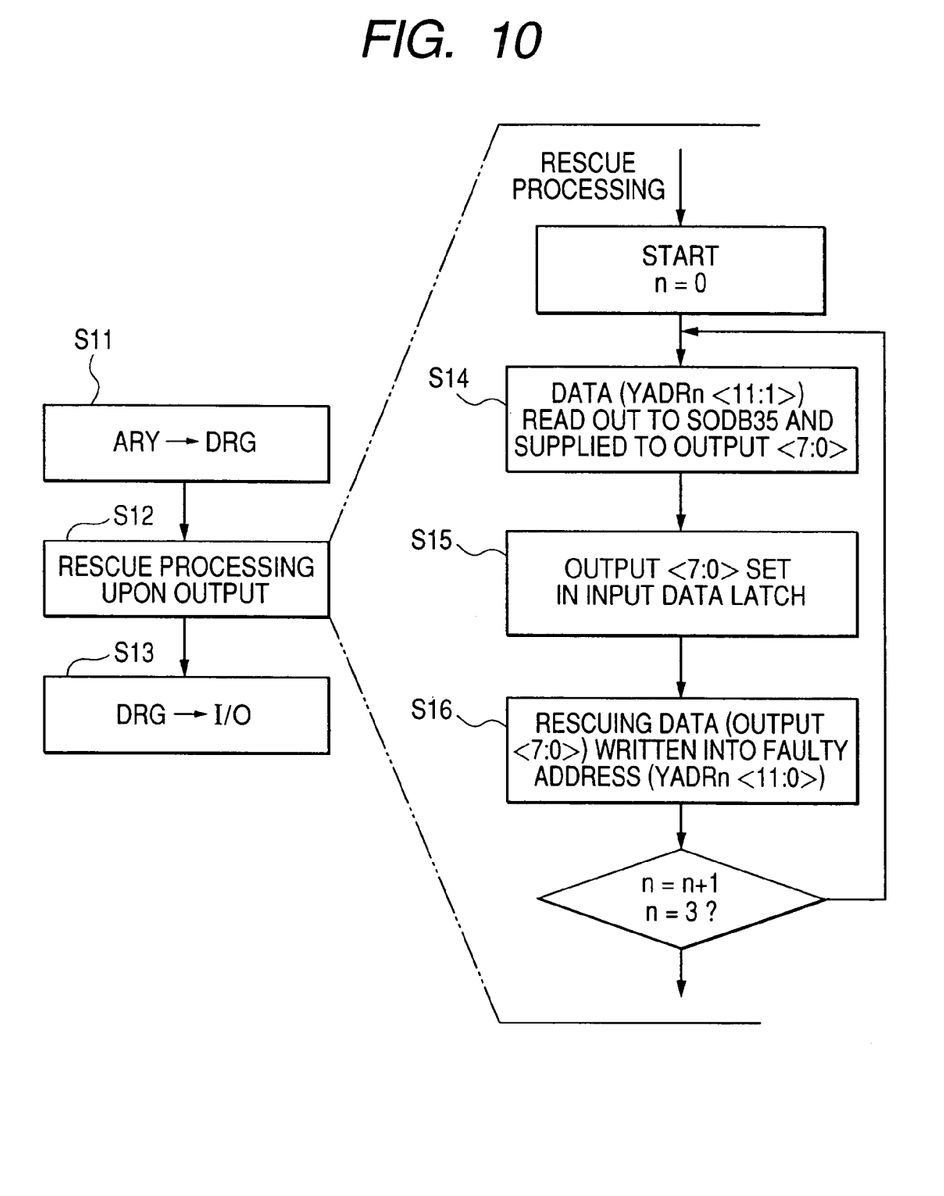
FIG. 10 is a flow chart showing an example of rescue processing flow at the time of data outputting.

FIG. 10 shows a rescue processing flow at the time of data outputting. In response to an instruction to read data, the flash read processing is performed in the memory bank, which is to be read out of, to transfer read data to the data register 5 (S11), followed by rescue processing on the data register (S12). After the rescue processing at the time of data outputting, the buffer read processing is made possible (S13). In rescue processing (S12) at the time of data outputting, rescuing data are read into SODB35 from the rescuing area RDRG designated by the rescuing address YFAD<11:1> on the data register (S14), the data are internally transferred from SODB35 to SIDB36 (S15), and data held by SIDB36 are written onto a data register designated by the faulty address YADR n<11:1> (S16). This processing is applied to four rescuing addresses YFAD0<11:1> through YFAD 3<11:1>. This causes data corresponding to the faulty addresses YADR 0<11:1> through YADR 3<11:1> in the main area MDRG_L of the data register 5_L to be replaced by the rescuing data of the redundant area RDRG_L. By supplying outward the stored information in the data register 5_L in this state, faulty data in the output data are replaced by rescuing data. Similar processing takes place when the data register 5_R side is selected.

Figure 11:
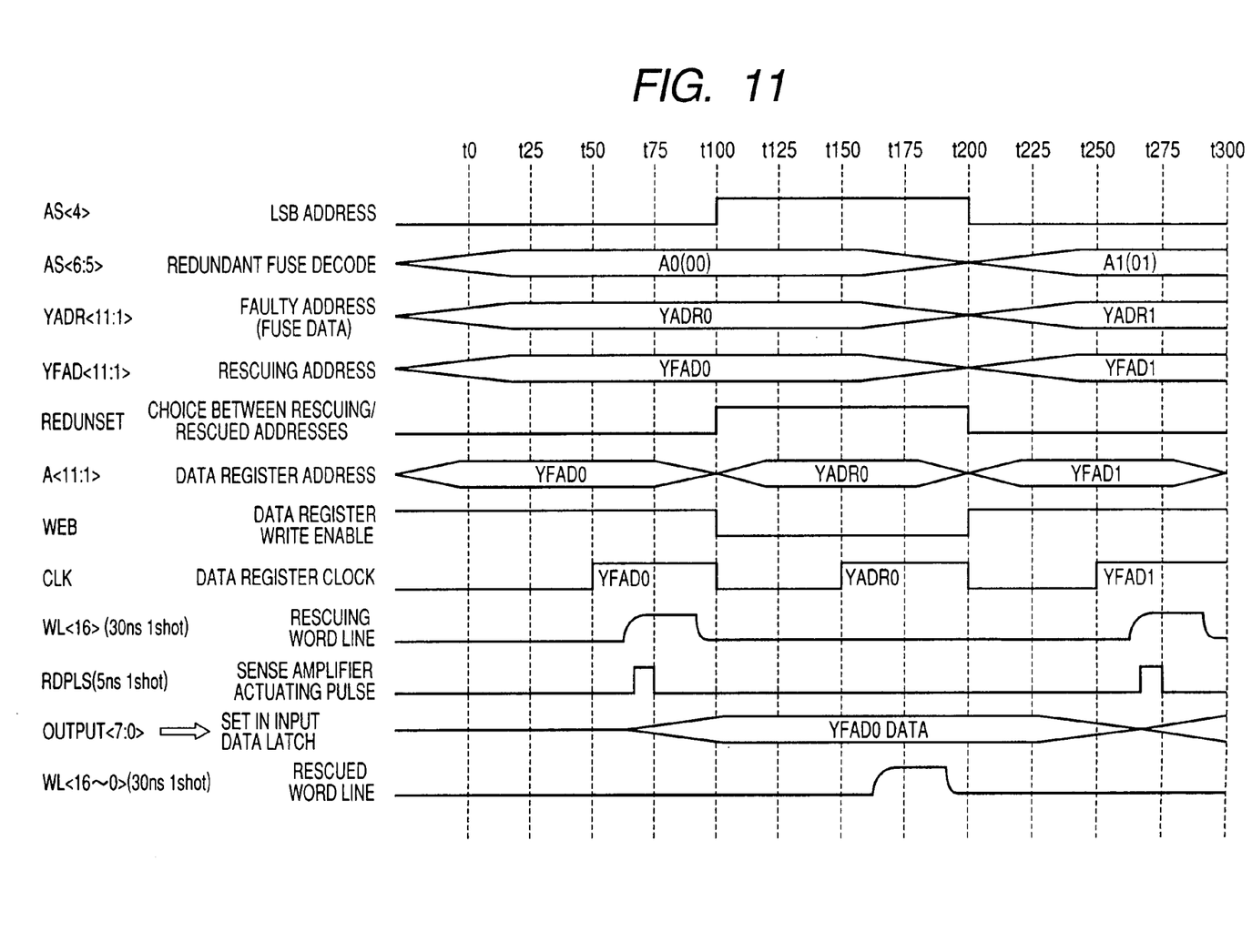
FIG. 11 is a timing chart showing the first half of rescue processing at the time of data outputting.
Figure 12:
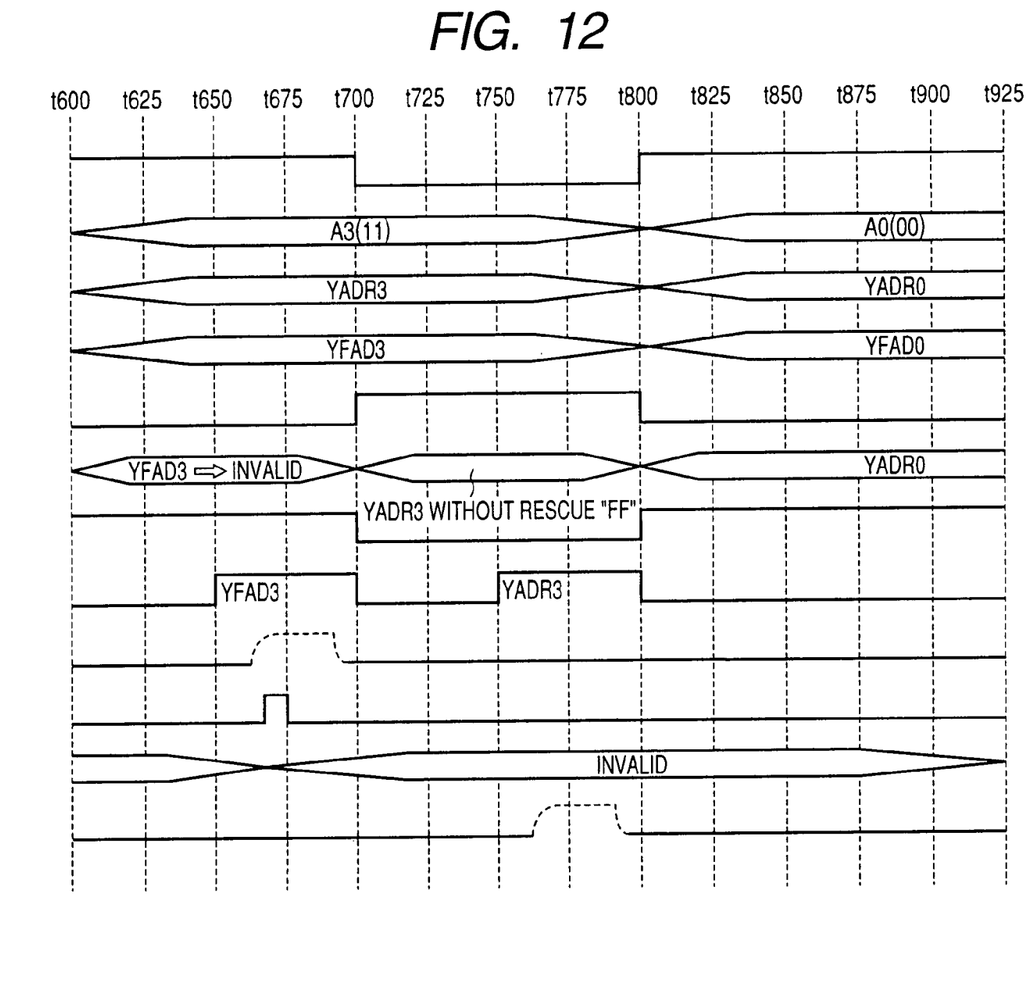
FIG. 12 is a timing chart showing the second half of rescue processing at the time of data outputting.

FIG. 11 and FIG. 12 are timing charts respectively showing the first and second halves of the rescue processing at the time of data outputting. Until time t200 in FIG. 11, the redundant fuse code AS<6, 5> is selected as A0<0,0>, and a faulty address YADR 0 is outputted from the fuse circuit as fuse data, when the rescuing address is YFAD 0. In the first half until time t100, the rescuing address YFAD 0 is selected as the data register address A<1:1>, the data YFAD 0 DATA of the rescuing address are latched from SODB35 to SIDB36. In the second half from time t100 through t200, the faulty address YADR 0 is selected as the data register address A<1:1>, and the data YFAD 0 DATA of SIDB36 are stored at the faulty address YADR 0.

From time t600 through t800 in FIG. 12, the redundant fuse code AS<6, 5> is selected as A3<1, 1>, the faulty address YADR 3 is supplied from the fuse circuit as fuse data, when the rescuing address is YFAD 3. In this example, YFAD<10> of YFAD 3 indicates the absence of rescue. Then, no word line is selected in the SRAM array 31, where read operation is restrained. As a logical product 1 is set for every bit in YFAD 3, indicating the absence of rescue, write operation is also restrained, with no word line selected.

Figure 13:
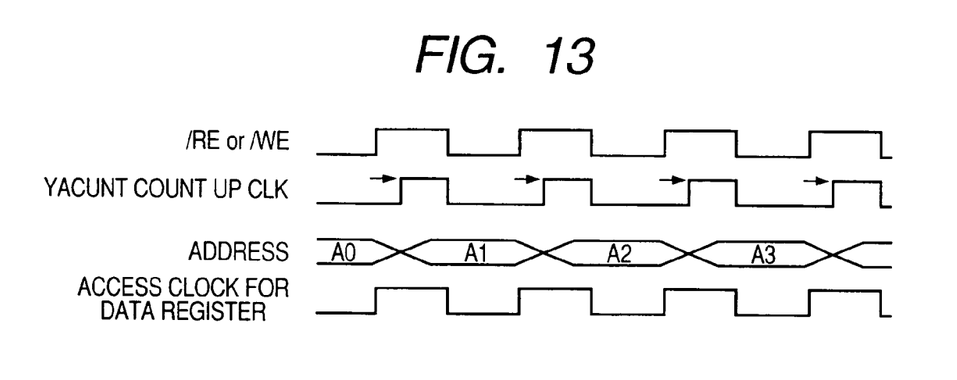
FIG. 13 is a timing chart showing the timing of access processing to and from a data register 5 in the processing of an input to the data register 5 before rescue processing upon inputting (S1 in FIG. 7) and in the processing of an external output from the data register 5 after the rescue processing upon outputting (S13 in FIG. 10).
Figure 14:
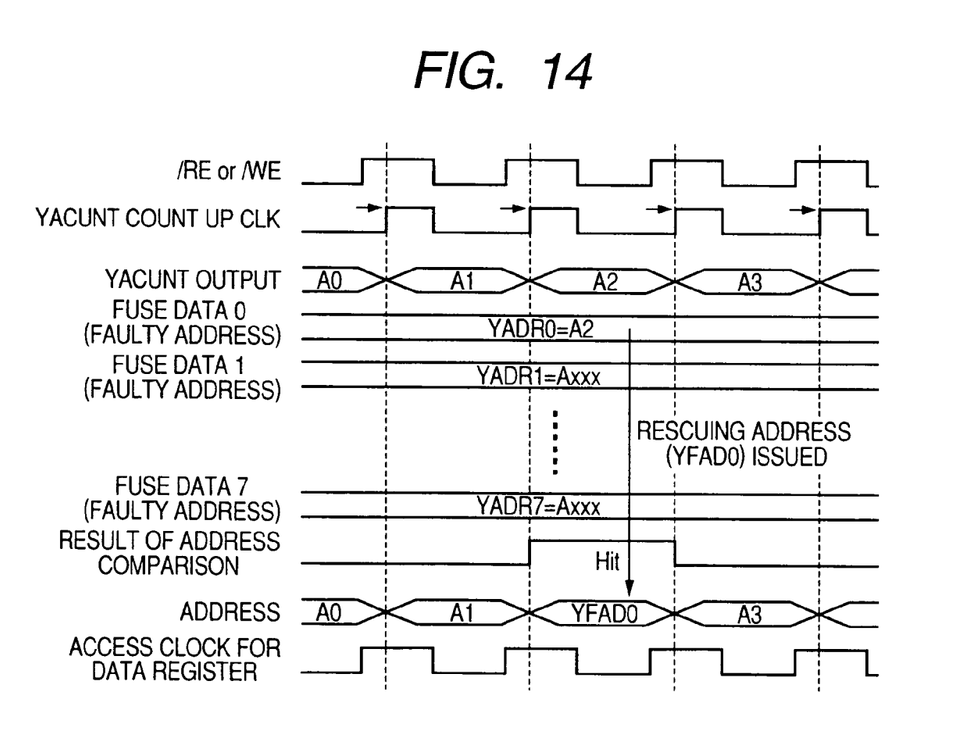
FIG. 14 is a timing chart of the operational timing of rescue from fault where no fault processing is performed on the data register.

FIG. 13 shows the timing of access processing to and from the data register 5 in the processing of an input to the data register 5 before rescue processing upon inputting (S1 in FIG. 7) and in the processing of an external output from the data register 5 after the rescue processing upon outputting (S13 in FIG. 10). According to this chart, the data register 5 can successively repeat data inputting or data outputting according to the output address of the Y address counter circuit (YACUNT) 12. There is no need to compare every output address of the Y address counter circuit (YACUNT) 12 and the faulty address. No such address comparison is needed in the rescue processing (step S2 in FIG. 7 and step S12 in FIG. 10) either. As described with reference to the timing charts of FIG. 8, FIG. 9, FIG. 11 and FIG. 12, it is sufficient only to read out faulty addresses by successively designating fuse sets in the fuse circuit 41 and, along with that, to designate the corresponding rescuing addresses. Where no rescue processing is performed on the data register, it will be necessary to compare, as exemplified in FIG. 14, every output address of YACUNT with every faulty address and, if the compared addresses are found identical, to replace the pertinent access address with a rescuing address, and access the data register by using the replacing rescuing address. Comparison of every access address takes time, inevitably entailing a drop in accessing speed.

Further, if the above-described rescue processing is used in a configuration in which data inputs and outputs can be selected in (8 bits or (16 bits, the efficiency of Y address rescuing can be improved as compared with the configuration in which address comparison is compared for each access address. Thus, in (8-bit inputting/outputting, the left and right data registers 5_L and 5_R are separately selected for each Y address, while in (16-bit inputting/outputting, the left and right data registers 5_L and 5_R are selected in parallel for each Y address. Therefore, as described with reference to the comparative example of FIG. 14, where the configuration is such that comparison with a faulty address is performed for each Y address, even if each of the left and right redundant areas RARY_L and RARY_R has a four-byte rescuing area, only two-byte rescuing can be done in Y address units. Even if there is only one-byte fault in a Y address, rescuing that faulty Y address would use a two-byte storage unit in the redundant area, which would accordingly be wastefully consumed. By contrast, rescue processing on the data register entails no comparison with the access address, but the data of the faulty address are directly replaced with those of the rescuing address, in further detail the replacement is separately done in each of the left and right main areas and redundant areas. Therefore, even if the left and right data registers 5_L and 5_R are selected in parallel for each Y address in (16-bit inputting/outputting, one-bit rescuing can be achieved in Y address units, and accordingly, where there is only one-byte fault in one Y address, consumption of only one-byte storage unit of the redundant area will be needed for rescuing that Y address, entailing no wasteful consumption of the redundant area.

Although the invention made by the present inventors has been hitherto described in specific terms with reference to some of the preferred embodiments thereof, the invention is not confined to these embodiments, but various modifications are obviously possible without deviating from its true spirit and scope.

For instance, the semiconductor memory apparatus is not limited to flash memories, but can be applied not only to nonvolatile memories such as mask ROMs and EEPROMs but also to volatile memories including SRAMs and DRAMs. Where it is applied to a mask ROM or an SRAM, the data registers can be composed of SRAMs as in the foregoing case. The external data input/output unit is not limited to configurations permitting selection between (8 bits and (16 bits. The choice may include (32 bits and (64 bits as well. The semiconductor nonvolatile memory is not limited to an LSI consisting solely of a memory. It may as well be a nonvolatile memory configured on the chip of a data processing LSI. The data storage units are not limited to pages of 1024+32 bytes each, but can be varied in constitution as appropriate.

What is claimed is:

1. A nonvolatile memory apparatus comprising:

a plurality of memory arrays;

a plurality of data registers to input and output data to and from respective ones of said memory arrays; and a plurality of control circuits, wherein said control circuits, after transferring data corresponding to faulty addresses from said memory arrays to said data registers in response to an instruction to read data, remove data to be rescued from the data transferred to said data registers and perform processing to replace the removed data to enable the data in the data register to be supplied to the outside of said nonvolatile memory apparatus, and said control circuits, after transferring data to said data registers in response to an instruction to write data, remove data corresponding to faulty addresses from the data transferred to said data registers, and perform processing to replace the removed data with data of rescuing addresses to enable the data in said data registers to be written into said memory arrays.

2. The nonvolatile memory apparatus according to claim 1, wherein said memory arrays include memory cells, said memory cells being electrically rewritable nonvolatile memory cells, and said data registers have a plurality of static memory cells as storage areas.

3. The nonvolatile memory apparatus according to claim 2, wherein said memory arrays have rescuing areas, each of which has a plurality of rescuing addresses allocated thereto, and which store data of faulty addresses and rescue areas to be rescued by said rescuing areas, and said control circuits have nonvolatile registers to store a plurality of faulty addresses.

4. The nonvolatile memory apparatus according to claim 3, wherein said control circuits use as a signal to designate a storage area in said nonvolatile registers, some of a plurality of bits contained in each address signal to designate said rescuing address.

5. A nonvolatile memory apparatus comprising:

a plurality of memory arrays;

a plurality of data registers to input and output data to and from respective ones of said memory arrays; and a plurality of control circuits, wherein each said memory array comprises a plurality of data storage units and, in each data storage unit, a rescue area and a rescuing area, and said control circuits, after storing data in an equivalent of said data storage units of said data registers in response to an instruction to write data, perform processing to replace data from said rescue areas with corresponding data from said rescuing areas in said data register to enable the data in the data registers to be written into the memory arrays.

6. A nonvolatile memory apparatus comprising:

a plurality of memory arrays;

a plurality of data registers to input and output data to and from respective ones of said memory arrays; and a plurality of control circuits, wherein each said memory array comprises a plurality of data storage units, and, in each data storage unit, a rescue area and a rescuing area, each said control circuit, after transferring data of a corresponding data storage unit from said memory array to said data register in response to an instruction to read data, performs processing to replace faulty data from said rescue area with corresponding data from a rescuing area in said data register to enable the data in the data register to be supplied to the outside of said data register, and said control circuits, after storing data in an equivalent of said data storage units into said data registers in response to an instruction to write data, further perform processing to replace data from said rescue area with corresponding data from said rescuing area in said data register to enable the data in the data register to be written into the memory array.

7. The nonvolatile memory apparatus according to claim 6, wherein each said memory array has a plurality of memory cells of which selection terminals and data input/output terminals are respectively connected to word lines and bit lines, and a storage area comprising memory cells connected to one word line constitutes one said data storage unit, and each said register includes a storage area equal to one said data storage unit in storage capacity.

8. The nonvolatile memory apparatus according to claim 6, wherein each said control circuit has a nonvolatile register to store, as faulty addresses, a plurality of addresses in the rescue area to be rescued by said rescuing area.

9. The nonvolatile memory apparatus according to claim 8, wherein each said control circuit determines a specific value held by said nonvolatile register as indicating an absence of rescue, and restrains said replacement processing based on said value.

10. The nonvolatile memory apparatus according to claim 9, wherein the memory cells of said memory arrays are electrically rewritable nonvolatile memory cells, and said data registers have a plurality of static memory cells in their storage areas.

* * * * *